United States Patent [19]
Sato

[11] 4,195,238
[45] *Mar. 25, 1980

[54] ADDRESS BUFFER CIRCUIT IN SEMICONDUCTOR MEMORY

[75] Inventor: Takashi Sato, Kodaira, Japan

[73] Assignee: Hitachi, Ltd., Japan

[*] Notice: The portion of the term of this patent subsequent to Feb. 14, 1995, has been disclaimed.

[21] Appl. No.: 866,370

[22] Filed: Jan. 3, 1978

Related U.S. Application Data

[62] Division of Ser. No. 692,367, Jun. 3, 1976, Pat. No. 4,074,148.

[30] Foreign Application Priority Data

Jun. 4, 1975 [JP] Japan ........................... 50-66565

[51] Int. Cl.² .................. H03K 3/286; H03K 3/353; G11C 8/00
[52] U.S. Cl. .................... 307/270; 307/279; 307/DIG. 1; 307/DIG. 4; 365/230; 307/DIG. 5
[58] Field of Search ............. 307/238, 279, DIG. 1, 307/ DIG. 3, DIG. 5, 270; 365/230, 231

[56] References Cited

U.S. PATENT DOCUMENTS

| | | | |
|---|---|---|---|
| 3,758,794 | 9/1973 | Kosonocky | 307/304 |
| 3,848,237 | 11/1974 | Geilhufe et al. | 307/238 X |
| 3,868,657 | 2/1975 | Hoffman et al. | 307/238 X |
| 3,902,082 | 8/1975 | Proebsting et al. | 307/238 X |
| 3,906,464 | 9/1975 | Lattin | 307/DIG. 5 X |
| 3,938,109 | 2/1976 | Gionis et al. | 307/DIG. 5 X |
| 3,940,747 | 2/1976 | Kuo et al. | 307/DIG. 5 X |
| 3,946,369 | 3/1976 | Pashley | 307/DIG. 5 X |
| 3,959,781 | 5/1976 | Mehta et al. | 307/DIG. 1 X |
| 3,969,706 | 7/1976 | Proebsting et al. | 307/DIG. 4 X |
| 4,031,415 | 6/1977 | Redwine et al. | 307/DIG. 5 X |

OTHER PUBLICATIONS

Anderson, "Address Encoding Circuit"; *IBM Tech. Discl. Bull.*, vol. 17, No. 3, pp. 796–797; 8/1974.

Furman, "Address Buffer True/Complement Generator"; *IBM Tech. Discl. Bull.*, vol. 18, No. 11, pp. 3597–3598; 4/1976.

Gladstein et al., "Low-Power Ratioless True-Complement Buffer"; *IBM Tech. Discl. Bull.*; vol. 18, No. 8, pp. 2591–2592; 1/1976.

*Primary Examiner*—Larry N. Anagnos
*Attorney, Agent, or Firm*—Craig and Antonelli

[57] ABSTRACT

In an address buffer circuit in a semiconductor memory including a flip-flop formed of MISFETs and an output circuit consisting of two drivers each formed of MISFETs, and producing a binary address signal, the flip-flop is supplied with a constant operating voltage and triggered by a pulse signal of a shorter pulse width than that of a chip enable signal and the MISFETs of the driver on the ground side have the gates cross-coupled to the outputs of the respective drivers so that at least one grounding MISFET in each driver is turned on in the outputting period to prevent the floating of the output level.

11 Claims, 5 Drawing Figures

ADDRESS BUFFER CIRCUIT IN SEMICONDUCTOR MEMORY

This is a division of application Ser. No. 692,367, filed June 3, 1976, now U.S. Pat. No. 4,074,148.

BACKGROUND OF THE INVENTION

1. Field of the Invention

This invention relates to an address buffer circuit, and more particularly to an address buffer circuit in a semiconductor memory.

2. Description of the Prior Art

Such address buffer circuits for use in a semiconductor memory circuit are known as one disclosed in Japanese Laid-Open patent application No. 96640/1974 corresponding to U.S. Pat. No. 3,795,898 which aims at rapid operation with the use of a dynamic flip-flop circuit as shown in FIG. 5. In this circuit, an insulated gate type field effect transistor (hereinbelow, referred to as metal-insulator-semiconductor; field-effect-transistor or MISFET $Q_1$ serves as a transfer gate for transferring a transistor-transistor logic (TTL) level into a MISFET logic level and transmitting an address input signal Ai to the gate of a switching MISFET $Q_5$ of a dynamic type flip-flop and to the gate of a MISFET $Q_8$ of the output circuit. Load MISFETs $Q_2$ and $Q_3$ of the flip-flop serve to supply current when both a chip enable signal CE as a control signal of the memory and the clock pulse $\phi$ take on a "1" level (i.e. a high level, description will be made in the case of N channel MISFETs hereinbelow). The outputs A and $\overline{A}$ of the flip-flop are determined according to the input signal Ai. The MISFETs $Q_6$ and $Q_8$ constituting an output circuit are turned on by the respective outputs $\overline{A}$ and A and select a predetermined decoder. Further, MISFETs $Q_7$ and $Q_9$ constituting the output driver circuit with the MISFETs $Q_6$ and $Q_8$ are turned on for the period of chip-nonselection ($\overline{CE}$="1") and hold both the outputs ai and $\overline{ai}$ at "0".

In the address buffer circuit of the above structure, the chip enable signal CE serves as the current source for the flip-flop circuit and supplies dc current through one inverter circuit ($Q_2$, $Q_4$) or ($Q_3$, $Q_5$) of the flip-flop circuit. Therefore, the pulse generator circuit for generating the chip enable signal CE should have a large current capacity, e.g., a driver circuit of large current capacity formed of bipolar transistors is needed. This brings about problems in the system packaging.

Further, when the chip enable signal CE is "0" (ground level), the input signal Ai is "1" (high level) and the clock pulse $\phi$ is "1", input current is allowed to flow through the MISFETs $Q_1$ and $Q_2$. In this case, since the number of address buffer circuits is usually over ten in a semiconductor memory circuit, the current consumption becomes large. A total memory system comprises a plurality of such semiconductor memory circuits, and hence the total current consumption becomes even larger.

Further, when a word selection line is activated, one pair of MISFETs ($Q_6$, $Q_7$) or ($Q_8$, $Q_9$) of the output circuit are turned off. Thus, the output level of the driver formed of the turned-off MISFETs floats. Then, the decoder connected to such a driver also floats. Therefore, the level of such a decoder may be easily affected by external noises or stray capacitances in the circuit formed in a semiconductor chip to cause malfunctions.

SUMMARY OF THE INVENTION

This invention aims to solve the above problems, and an object of this invention is to provide an address buffer circuit capable of reducing the current through the input circuit and of preventing the floating of the output level.

According to a basic embodiment of this invention, there is provided an address buffer circuit in a semiconductor memory formed in a semiconductor chip and requiring two opposite output signals ai and $\overline{ai}$ for an input signal Ai, comprising a dynamic type flip-flop for receiving the input signal Ai and supplying outputs A and $\overline{A}$ and an output circuit for receiving the output signals A and $\overline{A}$ of the flip-flop and supplying output signals ai and $\overline{ai}$, wherein said power source terminals of the dynamic type flip-flop are supplied with a constant operating voltage, the gate of a load MISFET of the flip-flop is applied with a signal for turning on the load MISFET for a predetermined short period in synchronism with a chip enable signal, the outputs A and $\overline{A}$ of the flip-flop are applied to the gates of respective MISFETs of the driver circuits constituting the output circuit, the gate of the other MISFET of each driver circuit is applied with a signal of inverted phase to the signal applied to the gate of the abovementioned MISFET, one, and MISFETs are connected in parallel with the MISFETs on the ground potential side of the flip-flop and the output circuit and driven to be conductive in the period of chip-nonselection.

The above and other objects, features and advantages of this invention will become apparent from the following description of the embodiment of this invention when taken in conjunction with the accompanying drawings.

DESCRIPTION OF THE PREFERRED EMBODIMENTS

Figure 1:
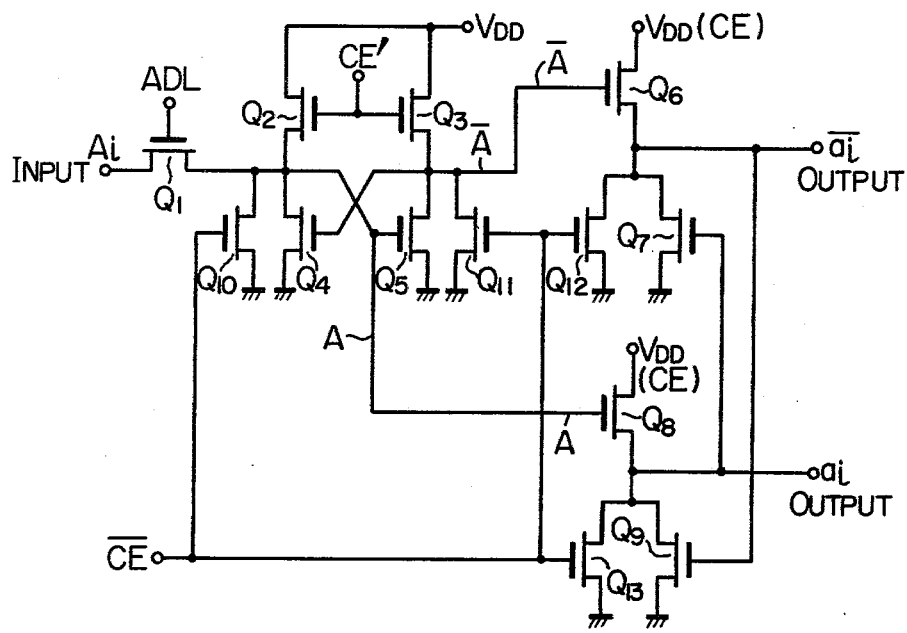
FIG. 1 is a circuit diagram of an embodiment of the address buffer circuit according to this invention.
Figure 5:
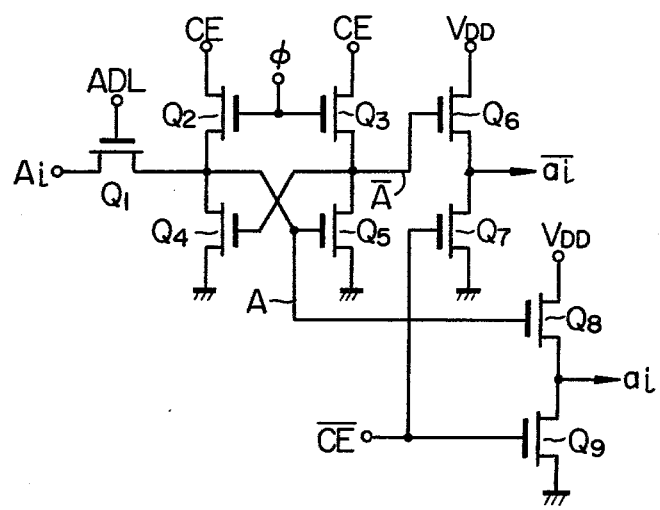
FIG. 5 is a circuit diagram of a conventional address buffer circuit.

FIG. 1 shows an address buffer circuit which has a structure basically analogous to that of the conventional circuit of FIG. 5. Throughout the figures, similar reference numerals indicate similar parts. A dynamic type flip-flop circuit comprises MISFETs $Q_2$ to $Q_5$. The MISFETs $Q_2$ and $Q_3$ serve as the load of the flip-flop. A signal CE' in synchronism with a chip enable (also called cenable) signal CE as described later is applied to the gates of the load MISFETs $Q_2$ and $Q_3$ for reducing the dc current consumption in this flip-flop circuit. A power source, not shown supplies a constant operating voltage $V_{DD}$.

The address input signal Ai is applied through a transfer gate MISFET $Q_1$ to the gate of one input MISFET $Q_5$ of this flip-flop. The outputs A and $\overline{A}$ of the flip-flop are applied to an output circuit described below capable of preventing the floating of its output levels. The output circuit includes one driver circuit formed of MIS- FETs $Q_6$ and $Q_7$ and the other driver circuit formed of MISFETs $Q_8$ and $Q_9$. The outputs $\overline{A}$ and A of the flip-flop are applied to the gates of the MISFETs $Q_6$ and $Q_8$, respectively. The gates of the MISFETs $Q_7$ and $Q_9$ are applied with the outputs ai and $\overline{ai}$ of the driver circuits, respectively. Further, MISFETs $Q_{10}$ to $Q_{13}$ are connected in parallel with the MISFETs $Q_4$, $Q_5$, $Q_7$ and $Q_9$, respectively. The gates of these MISFETs $Q_{10}$ to $Q_{13}$ are applied with a signal $\overline{CE}$ which takes on a "1" (high) level during the period of chip-nonselection so as to determine the states of the flip-flop and the output signals ai and $\overline{ai}$. Thus, when the signal $\overline{CE}$ is at a "1" level, the outputs A and $\overline{A}$ of the flip-flop and the outputs ai and $\overline{ai}$ of the output circuit are assured to be at a "0" level.

Here, a power source for the output circuit may be the constant operating voltage source $V_{DD}$ or the chip enable signal CE providing another operating voltage (taking on a "1" level during the period of chip selection).

Figure 2:
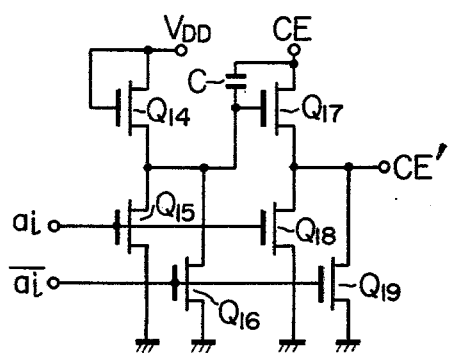
FIG. 2 is a circuit diagram of a pulse generator circuit.

The flip-flop circuit in a semiconductor memory is required to supply its outputs only for 30 to 40 nanoseconds upon the chip selection. Therefore, the signal CE' for driving the load MISFETs $Q_2$ and $Q_3$ may be generated by a circuit as shown in FIG. 2. In the circuit of FIG. 2, the following logic formula (1) is satisfied.

$$CE' = CE \,\overline{(ai + \overline{ai})} \quad (1)$$

Namely, parallel switching MISFETs $Q_{15}$ and $Q_{16}$ are connected to a load MISFET $Q_{14}$ in the former stage and the output signals ai and $\overline{ai}$ of the output circuit are applied to the gates of the MISFETs $Q_{15}$ and $Q_{16}$. The output of this circuit (former stage) drives the load MISFET $Q_{17}$ of the latter stage. To this load MISFET $Q_{17}$ are connected parallel MISFETs $Q_{18}$ and $Q_{19}$ which are applied with the output signals ai and $\overline{ai}$ of the output circuit, respectively. The construction of the latter stage is similar to the former stage. The chip enable signal CE is supplied to this latter stage circuit as the operating voltage.

Figure 3:
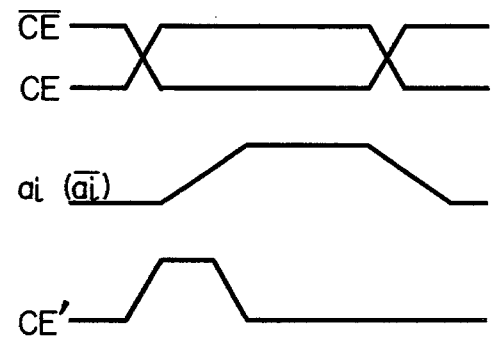
FIG. 3 shows operational waveforms in the circuit of FIG. 2.

As can be seen from the waveforms of FIG. 3, in the circuit of the above structure, since the output signals ai and $\overline{ai}$ have a time lag compared to the chip enable signal CE due to the time lags in the flip-flop and the output circuit, the output signal CE' of this pulse generator circuit takes on a "1" level from the time when the signal CE becomes "1" to the time when the signal ai or $\overline{ai}$ becomes "1".

The dynamic type flip-flop circuit driven by such a signal CE' allows only the minimum current flow to achieve considerable reduction in the power consumption. Here, the chip enable signal CE usually has a pulse width of 100 to 150 nanoseconds. Hence, the dc current consumption according to the above circuit is reduced at most below one half.

For forming a dynamic type flip-flop circuit, the load MISFETs $Q_2$ and $Q_3$ are applied with the constant voltage $V_{DD}$ and triggered by the signal CE' applied to the gates thereof. Thus, no current is allowed to flow between the input terminal Ai and the CE' terminal, and a reverse current is hardly allowed to flow from the input terminal Ai to the voltage source terminal $V_{DD}$. As a result, the reverse current decreases from a value of 0.7 mA to a value of 1 to 3 μA, compared with the conventional address buffer circuit in FIG. 5. Further, since the dynamic drive signal CE' of short pulse width is applied to the gates of the load MISFETs $Q_2$ and $Q_3$, the current capacity may be minimized.

The output circuit generates the output signals ai and $\overline{ai}$ through complementary switching MISFETs ($Q_6$, $Q_7$) and ($Q_8$, $Q_9$) and, hence, the output signals $\overline{ai}$ and ai cannot become floating. Since the switching MISFETs $Q_6$ and $Q_7$ ($Q_8$ and $Q_9$) operate in a complementary manner, there arises no problem even when the signal CE is used as the operating voltage source.

Further, during the chip-nonselection period, the signal $\overline{CE}$ which takes on a "1" level during the chip-nonselection period is applied to the MISFETs $Q_{10}$ to $Q_{13}$ to turn them on. Thus, the output lines of the flip-flop circuit are grounded to determine the initial value of the flip-flop circuit prior to the activation. Then, this flip-flop circuit will operate in response to the input signal Ai.

In the above description, the MISFETs used in the embodiment were all of N channel type. It will be apparent that a similar circuit can be formed by the use of P channel MISFETs. In such a case, the polarity of the operating source voltage should be reversed.

The load MISFETs $Q_2$ and $Q_3$ of the flip-flop may be driven by the chip enable signal CE. In such a case, however, care must be paid to a larger dc current consumption as described above.

Figure 4:
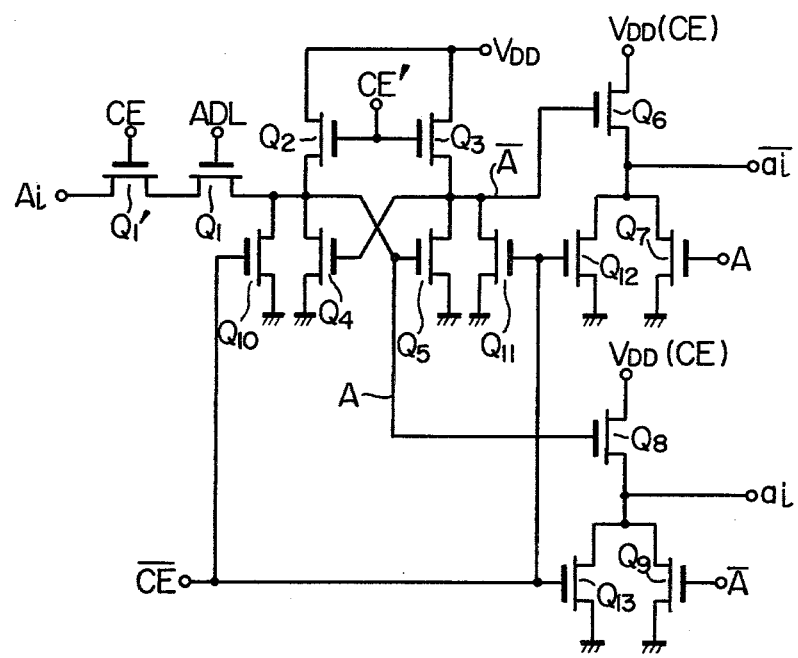
FIG. 4 is a circuit diagram of another embodiment of the address buffer circuit according to this invention.

Further, as in the circuit of FIG. 4, the outputs $\overline{A}$ and A (A and $\overline{A}$) of the flip-flop may be applied to the gates of the FETs $Q_6$ and $Q_7$ ($Q_8$ and $Q_9$) of the driver circuit.

Further, another MISFET $Q_1'$ controlled by the chip enable signal CE may be provided in the input circuit to prevent the input current from flowing through the MISFETs $Q_1$ and $Q_{10}$ in the chip nonselection period.

What is claimed is:

1. A driver circuit in an address buffer for a memory circuit comprising first, second, third, and fourth MISFETs, each having a source, a drain and a gate and in which the sources of said first and third MISFETs are respectively coupled to the drains of said second and fourth MISFETs for providing outputs of the buffer, characterized in that the gates of said first and third MISFETs are respectively coupled to complementary address input sources for providing complementary input signals, that the gates of said second and fourth MISFETs are cross-coupled to the drains thereof, and that output terminals are respectively connected to the drains of said second and fourth MISFETs, thereby causing one of complementary output signals appearing at either one of said output terminals in response to said complementary input signals to clamp to a potential provided to the source of said second and fourth MISFETs.

2. The driver circuit according to claim 1, wherein the sources of said second and fourth MISFETs are coupled to a reference potential and the drains of said first and third MISFETs are coupled to a control pulse source, and further including a fifth MISFET having a source and a drain respectively coupled to the source and drain of said second MISFET and a gate coupled to a complement source of said control pulse and a sixth MISFET having a source and a drain respectively coupled to the source and drain of said fourth MISFET and a gate coupled to said complement source.

3. The driver circuit according to claim 1, characterized in that each of said first and third MISFETs has a stray capacitance between the drain and the gate thereof, and a control pulse is applied to each drain of said first and third MISFETs to boost each gate potential thereof at a voltage greater in absolute value than that of said control pulse in cooperation with each of said stray capacitances.

4. An address buffer for a memory circuit comprising a first flip-flop which includes a pair of inverters each including a load MISFET and a driving MISFET and in which said load MISFETs are driven by a pulse, and an output circuit responsive to the output of said flip-flop for providing an output of the buffer characterized by means for generating a pulse signal to initiate driving said load MISFETs in response to the front edge of a control pulse signal in the memory circuit and to terminate driving the same in response to the outputs of said first flip-flop before the back edge of said control signal.

5. The address buffer according to claim 4, wherein one of said pair of inverters derives an address output signal complementary with that of the other and wherein said output circuit comprises a second flip-flop which includes first, second, third and fourth MISFETs, each having a source, a drain and a gate, the sources of said first and third MISFETs being respectively coupled to the drains of said second and fourth MISFETs, the gates of said first and third MISFETs being respectively coupled to the complementary address outputs of said first flip-flop, the gates of said second and fourth MISFETs being cross-coupled to the drains thereof, and in which output terminals are respectively connected to the drains of said second and fourth MISFETs for deriving complementary address output signals to drive a succeeding stage.

6. The address buffer according to claim 5, wherein said driving pulse generating means comprises an input terminal for receiving said control signal, a ground level terminal, an output terminal for providing an output signal having a voltage level substantially equal to that of said control signal in synchronism with said control signal, and means for short-circuiting the output terminal to the ground level upon application of any output signal from said second flip-flop.

7. An address buffer for a memory circuit comprising a first flip-flop for receiving an input and providing complementary outputs, and a second flip-flop for driving an address decoder in response to said complementary outputs of said first flip-flop, said second flip-flop having a pair of input terminals for receiving said complementary outputs from said first flip-flop and a pair of output terminals for providing complementary outputs to drive said address decoder, said input terminals of said second flip-flop being isolated in direct current from said output terminals of said second flip-flop so that said first flip-flop operates independently of said output terminals of said second flip-flop loaded with said address decoder.

8. The address buffer according to claim 7, wherein said second flip-flop comprises first and second series connections each of which is formed of first and second MISFETs connected in series with each other, first MISFETs in said first and second series connections having gates serving as said input terminals of the second flip-flop, the nodes between the series-connected MISFETs in respective ones of said first and second series connections serving as said output terminals of the second flip-flop, and said second MISFETs of the first and second series connections having gates cross-coupled to said output terminals of the first and second series connections.

9. The address buffer circuit according to claim 8, wherein each of said first and second flip-flops further includes a pair of MISFETs operable so as to clamp the complementary outputs thereof to a reference level in response to a control pulse, and wherein said first and second series connections of the second flip-flop are energized by the complement of said control pulse.

10. A driver circuit in an address buffer for a memory circuit comprising first and second series connections each including series-connected first and second MISFETs each of which has an insulated gate for controlling the conductivity thereof; a pair of input terminals respectively connected to said gates of the first MISFETs in said first and second series connections for applying complementary input address signals; a pair of output terminals respectively connected to the nodes of said first and second series connections between the series-connected first and second MISFETs for deriving complementary output signals; and means for cross-coupling the gates of said second MISFETs of said series connections to said output terminals thereof to render the series-connected first and second MISFETs in each of said series connections operative in a push-pull mode, thereby preventing said output terminals from floating.

11. The driver circuit according to claim 10, further comprising a pair of MISFETs respectively connected to said output terminals for clamping said output terminals to a reference level in response to a control pulse.

* * * * *